United States Patent
Joo et al.

(10) Patent No.: US 10,686,163 B2
(45) Date of Patent: Jun. 16, 2020

(54) DISPLAY DEVICE AND METHOD OF REWORKING THE DISPLAY DEVICE

(71) Applicant: Samsung Display Co., Ltd., Yongin-Si, Gyeonggi-Do (KR)

(72) Inventors: So Yeon Joo, Asan-si (KR); Se Hun Park, Cheonan-si (KR); Jeong Il Oh, Hwaseong-si (KR)

(73) Assignee: Samsung Display Co., Ltd. (KR)

(*) Notice: Subject to any disclaimer, the term of this patent is extended or adjusted under 35 U.S.C. 154(b) by 0 days.

(21) Appl. No.: 16/148,860

(22) Filed: Oct. 1, 2018

(65) Prior Publication Data

US 2019/0181389 A1 Jun. 13, 2019

(30) Foreign Application Priority Data

Dec. 13, 2017 (KR) .................. 10-2017-0171067

(51) Int. Cl.
| | | |
|---|---|---|
| *H01L 51/56* | (2006.01) | |
| *H01L 51/52* | (2006.01) | |
| *H01L 51/00* | (2006.01) | |
| *H01L 27/32* | (2006.01) | |

(52) U.S. Cl.
CPC ............ *H01L 51/56* (2013.01); *H01L 51/003* (2013.01); *H01L 51/5256* (2013.01); *H01L 27/3244* (2013.01); *H01L 51/524* (2013.01); *H01L 51/5246* (2013.01); *H01L 2251/568* (2013.01)

(58) Field of Classification Search
CPC ... H01L 51/56; H01L 51/003; H01L 51/5256; H01L 51/5246; H01L 2251/568; H01L 27/3244; G02F 1/1309; G01M 11/00; G09G 3/006
See application file for complete search history.

(56) References Cited

U.S. PATENT DOCUMENTS

| 2015/0129845 A1* | 5/2015 | Kim | .................... H01L 51/5256 |
| | | | 257/40 |
| 2016/0378231 A1* | 12/2016 | Kim | ........................ G06F 3/044 |
| | | | 345/174 |

FOREIGN PATENT DOCUMENTS

| KR | 10-1027795 B1 | 4/2011 |
| KR | 10-1765464 B1 | 8/2017 |

* cited by examiner

*Primary Examiner* — Joseph L Williams
*Assistant Examiner* — Jose M Diaz
(74) *Attorney, Agent, or Firm* — Innovation Counsel LLP

(57) ABSTRACT

Provided are a display device and a method of reworking the display device. The display device includes a display element; a window which is disposed to face the display element; an adhesive member which is disposed between the display element and the window and comprises a first adhesive layer disposed on a side of the display element and a second adhesive layer disposed on a side of the window; and a light transmitting film which is disposed between the first adhesive layer and the second adhesive layer.

18 Claims, 11 Drawing Sheets

DISPLAY DEVICE AND METHOD OF REWORKING THE DISPLAY DEVICE

This application claims the benefit of Korean Patent Application No. 10-2017-0171067, filed on Dec. 13, 2017, in the Korean Intellectual Property Office, the disclosure of which is incorporated herein by reference in its entirety.

BACKGROUND

1. Field

The present disclosure relates to a display device and a method of reworking the display device.

2. Description of the Related Art

Display devices are being developed which have various shapes and functions and are applied to portable devices such as smartphones and tablet computers. Unlike conventional display devices, some of these display devices with various shapes include examples such as curved display devices, bended display devices, bendable display devices, foldable display devices, stretchable display devices, and rollable display devices.

Such a display device includes a display panel and a window, and the display panel may include pixels implemented on a substrate. The window covers the display panel to protect the display panel from external impact and stress. The window is processed to have shapes corresponding to various shapes of the display panel. Therefore, the window may be a relatively expensive part among unit parts of the display device. When the display device is found to be defective during the process of manufacturing the display device, rework for separating the display panel and the window may be required.

SUMMARY

Aspects of the present disclosure provide a display device which can be reworked, for example, disassembled without damage to a display element or a window and a method of reworking the display device.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment, there is provided a display device. The display device includes a display element; a window which is disposed to face the display element; an adhesive member which is disposed between the display element and the window and comprises a first adhesive layer disposed on a side of the display element and a second adhesive layer disposed on a side of the window; and a light transmitting film which is disposed between the first adhesive layer and the second adhesive layer.

The display device may have wherein at least a side of the light transmitting film protrudes further outward than the adhesive member.

The display device may have wherein the light transmitting film is made of a polymer material.

The display device may have wherein the light transmitting film comprises polyimide (PI).

The display device may further include an ink layer which is disposed on edges of a surface of the window which faces the display element, wherein a portion of the second adhesive layer overlaps at least a portion of the ink layer.

The display device may have wherein the adhesive member is an optical clear adhesive (OCA) or an optical clear resin (OCR). According to an embodiment, there is provided a display device. The display device includes a display element; a window which is disposed to face the display element; an adhesive member which is disposed between the display element and the window; and a light transmitting film which is inserted into the adhesive member.

The display device may have wherein the adhesive member is divided into a first adhesive layer and a second adhesive layer spaced apart from each other by the light transmitting film, wherein the first adhesive layer is attached to the display element, and the second adhesive layer is attached to the window.

The display device may have wherein at least a side of the light transmitting film protrudes further outward than the adhesive member.

The display device may have wherein the light transmitting film is made of a polymer material.

The display device may have wherein the light transmitting film comprises PI.

The display device may further include an ink layer which is disposed on edges of a surface of the window which faces the display element, wherein a portion of the adhesive member overlaps at least a portion of the ink layer.

The display device may have wherein the adhesive member is an OCA or an OCR.

According to an embodiment, there is provided a method of reworking a display device. The method includes disassembling the display device to prepare a part comprising a window which is disposed to face a display element, an adhesive member which is disposed between the display element and the window and comprises a first adhesive layer attached to the display element and a second adhesive layer attached to the window, and a light transmitting film which is disposed between the first adhesive layer and the second adhesive layer; separating the display element and the window, to which the first adhesive layer and the second adhesive layer are respectively attached, by removing the light transmitting film by applying an external force to one side of the light transmitting film; and removing the adhesive member from the display element and/or the window by providing a washing agent to the first adhesive layer and/or the second adhesive layer.

The method may have wherein the removing of the adhesive member by providing the washing agent includes: letting the washing agent permeate and swell the first adhesive layer or the second adhesive layer; and removing the swollen first adhesive layer or the swollen second adhesive layer.

The method of claim 14, wherein the washing agent comprises one or more of alkyl acetate, alkyl lactate, isopropyl alcohol, alkyl siloxane, glycol ether, and limonene limonene.

The method may have, wherein at least a side of the light transmitting film protrudes further outward than the adhesive member.

The method may have wherein the light transmitting film is made of a polymer material.

The method may have wherein the light transmitting film comprises PI.

The method may further include preparing an ink layer which is disposed on edges of a surface of the window which faces the display element, wherein a portion of the second adhesive layer overlaps at least a portion of the ink layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
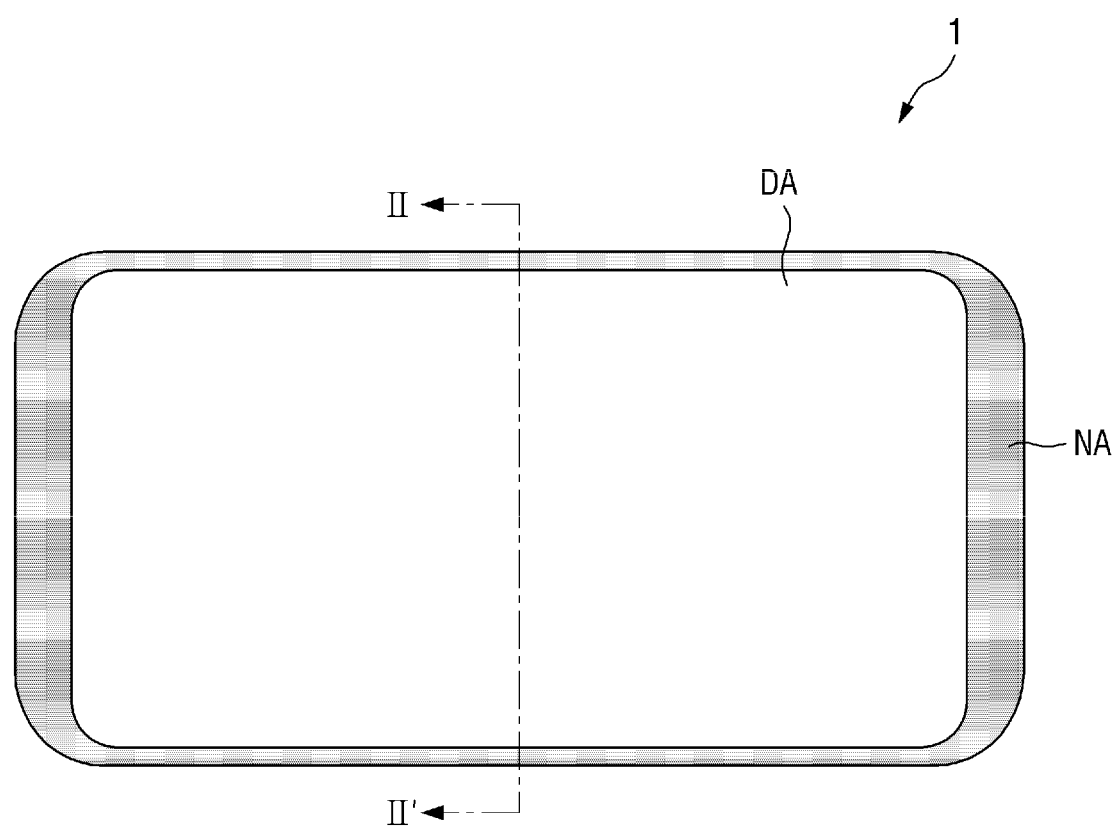
FIG. 1 is a plan view of a display device according to an embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a" "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected to or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Throughout the specification, the same reference numerals are used for the same or similar elements.

Hereinafter, embodiments of the present disclosure will be described with reference to the accompanying drawings.

A display device according to embodiments may be a light receiving display device such as a liquid crystal display device or an electrophoretic device or a self-luminous display device such as an organic light emitting display device or a plasma display device. Hereinafter, a frameless organic light emitting display device without a top cover for covering a portion of an upper surface or an organic light emitting display device having a thin and narrow bezel will be described as an example, but embodiments are not limited to this example.

FIG. 1 is a plan view of a display device 1 according to an embodiment.

Referring to FIG. 1, the display device 1 includes a display area DA and a non-display area NA in plan view. The display area DA is an area in which an image displayed by a display element 300 is visible, and the non-display area NA is an area in which the image is not visible. The non-display area NA is disposed around the display area DA. For example, when the display area DA is formed in a quadrilateral shape, the non-display area NA may be disposed outside the display area DA along edges of the display area DA.

Although not illustrated in the drawing, a plurality of pixels may be defined in the display area DA. The pixels may be arranged in a matrix form. Signal wirings for driving each pixel, such as a gate line and a data line, may be disposed at the boundary of each pixel. In the non-display area NA, a part to which an external driving element such as a driver chip or a printed circuit board is connected may be located. In addition, holes corresponding to a speaker, a camera, buttons, etc., which may be included in the display device 1, may be formed in the non-display area NA.

Figure 2:
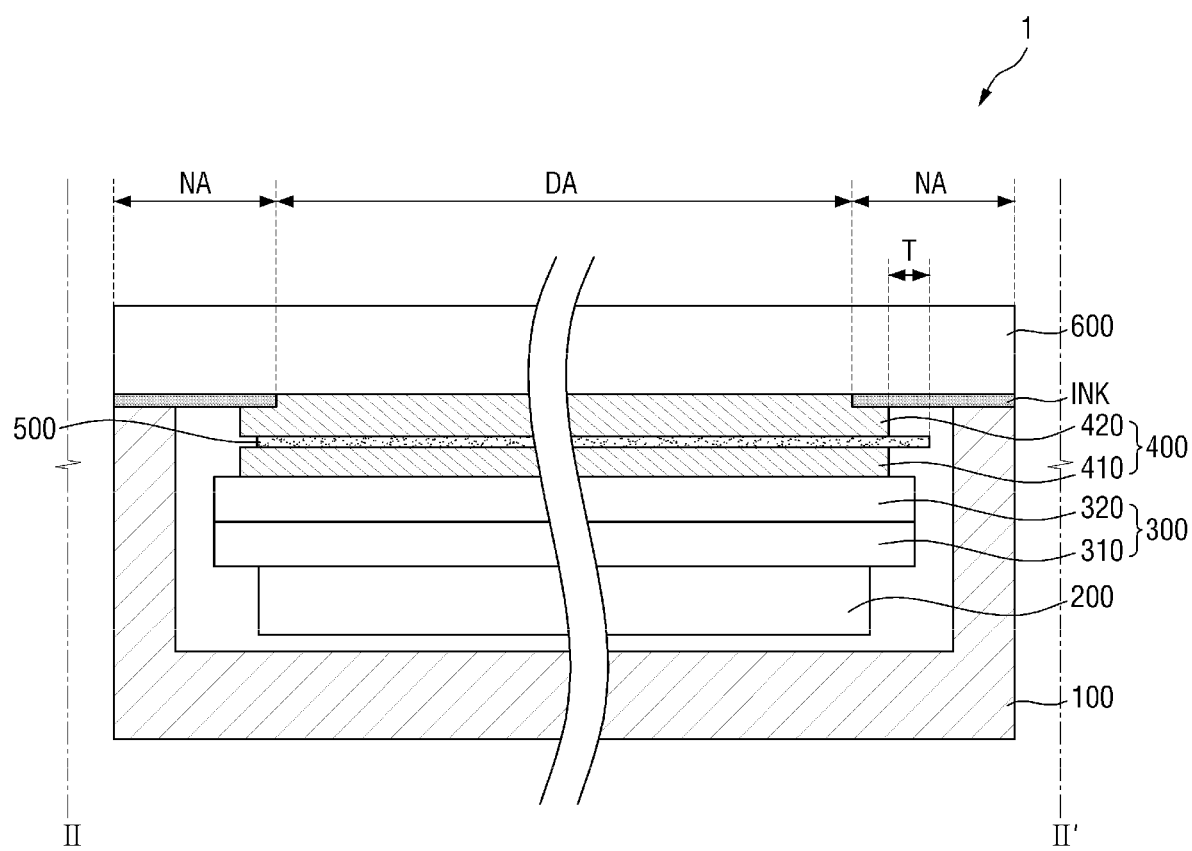
FIG. 2 is a cross-sectional view of the display device of FIG. 1, taken along the line II-II'.

FIG. 2 is a cross-sectional view of the display device 1 of FIG. 1, taken along the line II-II'.

Referring to FIG. 2, the display device 1 includes a chassis 100, a lower sheet 200, the display element 300, an adhesive member 400, a light transmitting film 500, and an ink layer INK.

The chassis 100 is disposed in a lower part of the display device 1. The chassis 100 may be shaped like a plate having a bottom and sidewalk to accommodate elements of the display device 1. The sidewalls of the chassis 100 may support a window 600. However, embodiments are not limited to this case, and the sidewalk of the chassis 100 may cover edges of the window 600.

The lower sheet 200 is disposed on the bottom of the chassis 100. The lower sheet 200 may be attached to a lower surface of the display element 300 to perform a buffering function for protecting the display element 300 from external impact and/or a heat dissipation function for dissipating heat generated from the display element 300. Furthermore, the lower sheet 200 may further perform an electromagnetic wave shielding function, a pattern detection preventing function, a grounding function, a strength enhancing function and/or a digitizing function.

Although not illustrated in the drawing, a printed circuit board may be disposed between the chassis 100 and the lower sheet 200 to transmit a driving signal for realizing an image to the display element 300.

The display element 300 is disposed on the lower sheet 200. The display element 300 is an element for realizing an image and may be provided in the form of a panel including a first substrate 310 and a second substrate 320 disposed on the first substrate 310.

The first substrate 310 may be a substrate on which thin film transistors (TFTs) as switching elements are formed in a matrix form. Although not illustrated in the drawing, a data line and a gate line may respectively be connected to a source terminal and a gate terminal of each of the TFTs, and a pixel electrode made of a conductive material may be connected to a drain terminal.

A gate pad (not illustrated) and a data pad (not illustrated) connected to an end of the gate line and arm end of the data line may be disposed in an area of the first substrate 310 which corresponds to the non-display area NA in plan view. The gate pad and the data pad may be electrically connected to the printed circuit board by a flexible circuit board (not illustrated) to receive a driving signal or the like.

The second substrate 320 may be disposed to face the first substrate 310. A common electrode (not illustrated) made of a conductive material may be formed on the second substrate 320 to face the pixel electrode formed on the first substrate 310. In an embodiment, RGB pixels for representing colors may be formed on the second substrate 320 in the form of thin films.

Although not illustrated in the drawing, the display element 300 may further include an organic light emitting element interposed between the first substrate 310 and the second substrate 320. In this case, the second substrate 320 may include a protective layer, a sealing layer, an encapsulation layer, etc. for protecting the organic light emitting element.

In some embodiments, the display element 300 may further include a touch sensing unit (not illustrated) or a polarizing element (not illustrated) attached to or embedded in the display element 300.

The adhesive member 400 is disposed on the display element 300. The adhesive member 400 is a layer for bonding and fixing the display element 300 and the window 600 to each other and may include an adhesive material such as a light transmitting resin. That is, the adhesive member 400 may be an optical clear adhesive (OCA) or an optical clear resin (OCR).

Specifically, the light transmitting resin may be a photocured resin. The photocured resin may be a photocurable resin cured to have adhesive strength by polymerization of the photocurable resin composed of monomers, oligomers, etc. into a polymer through irradiation of light of a specific wavelength.

In an embodiment, the photocurable resin may be a material cured by ultraviolet (UV) irradiation. The photocurable resin may include acrylic, a (meth) acrylic compound, etc. In addition, the photocurable resin may further include a photoinitiator that generates free radicals or ions upon stimulation by light such as UV light. Examples of the photoinitiator include alpha-hydroxy ketone, mono- or his acyl phosphine oxide, benzophenone, thioxanthone, ketosulfone, benzyl ketal, phenylglyoxylate, borate, titanocene and oxime ester photoinitiators.

Apart from the photocured resin, the adhesive member 400 may include a resin cured through stimulation by temperature, humidity, physical impact, chemicals, etc. The type of stimulation that triggers curing is not limited as long as a material can be cured to have adhesive strength.

The light transmitting film 500 may be inserted into the adhesive member 400. The light transmitting film 500 may horizontally cross the adhesive member 400, and the adhesive member 400 may be divided into a first adhesive layer 410 located on the side of the display element 300 and a second adhesive layer 420 located on the side of the window 600 by the light transmitting film 500.

A surface (a lower surface in the drawing) of the first adhesive layer 410 may be attached to the display element 300, and an opposite surface (an upper surface in the drawing) of the first adhesive layer 410 may be attached to the light transmitting film 500. A surface (an upper surface in the drawing) of the second adhesive layer 420 may be attached to the window 600, and an opposite surface (a lower surface in the drawing) of the second adhesive layer 420 may be attached to the light transmitting film 500.

The first adhesive layer 410 and the second adhesive layer 420 may be completely separated from each other by the light transmitting film 500 and may be indirectly attached and fixed to each other by the light transmitting film 500. However, embodiments are not limited to this case. When the area of the light transmitting film 500 is too small to completely cover the first adhesive layer 410 and the second adhesive layer 420, the first adhesive layer 410 and the second adhesive layer 420 may be at least partially directly attached to each other or integrated with each other in an area not covered by the light transmitting film 500.

As will be described later, the light transmitting film 500 may enable the display element 300 and the window 600 to be easily separated from each other when the display device 1 is reworked. The light transmitting film 500 may be a film made of a polymer material having a light transmitting property and stretchability. Specifically, the light transmitting film 500 may include polyimide (PI). However, the material that forms the light transmitting film 500 is not limited to polyimide, and the light transmitting film 500 may be any member that has a light transmitting property and appropriate stretchability and/or has appropriate adhesive strength or adhesion to the adhesive member 400.

Figure 3:
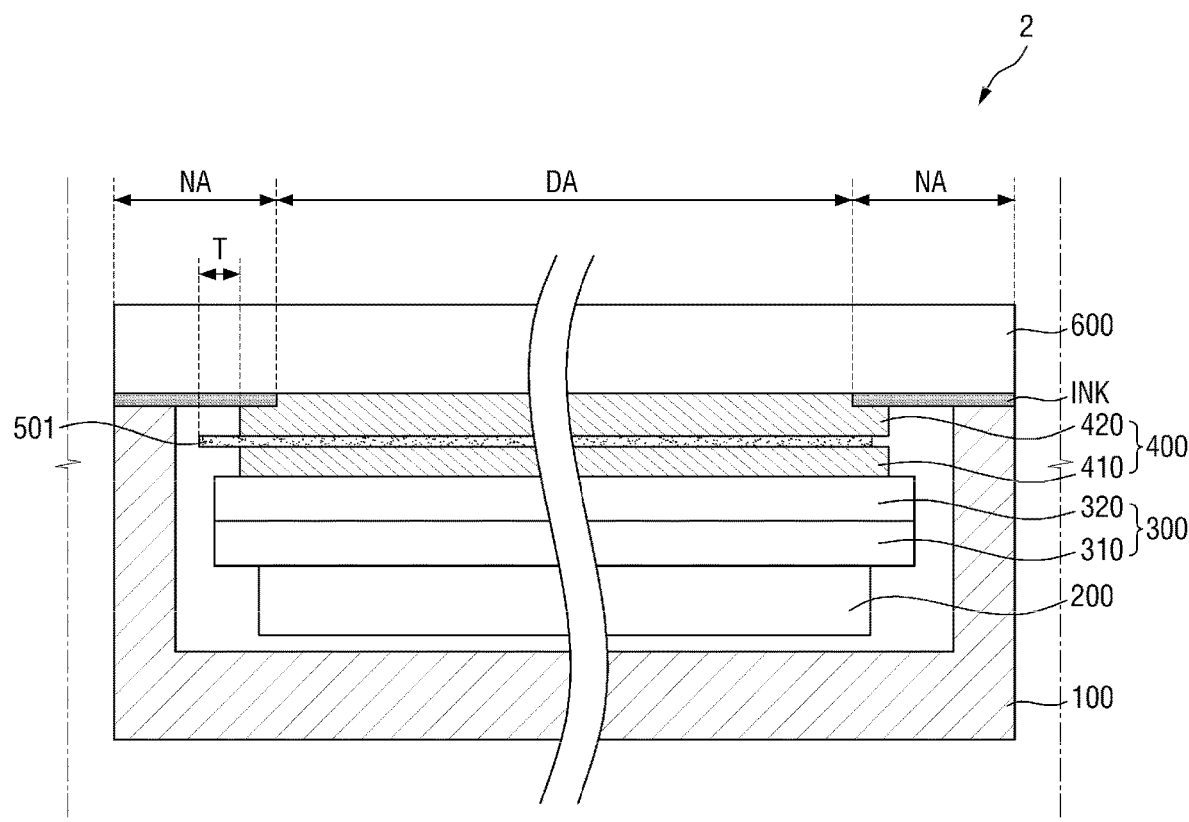
FIGS. 3 and 4 are cross-sectional views of display devices according to embodiments.
Figure 4:
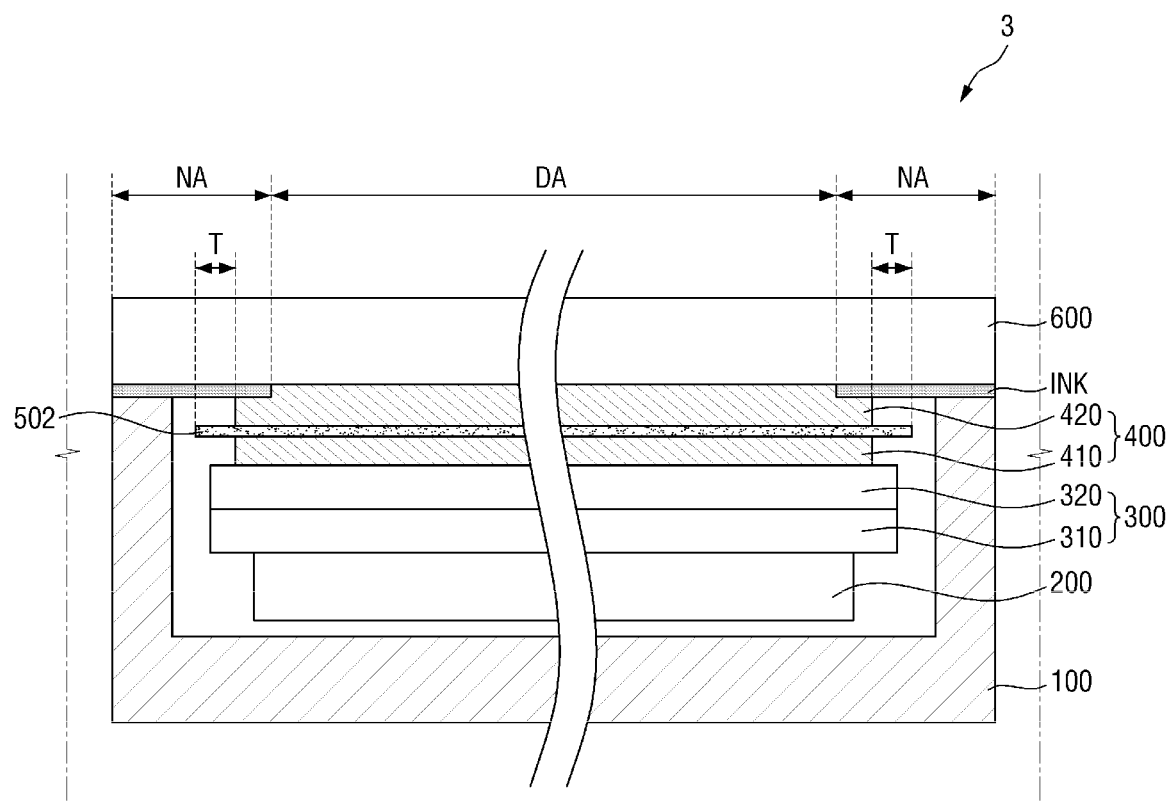

A side of the light transmitting film 500 may protrude further outward than a side surface of the adhesive member 400 by a predetermined distance T. Although a right side of the light transmitting film 500 protrudes in the drawing, a left side and/or both sides of the light transmitting film 500 can also protrude as illustrated in FIG. 3 or 4 to be described later. That is, the direction in which the light transmitting film 500 protrudes is not limited to a particular direction.

By using the protruding portion of the light transmitting film 500, the light transmitting film 500 can be easily removed from the adhesive member 400, as will be described later.

The window 600 is disposed on the adhesive member 400. The display element 300 and the window 600 may be attached and fixed to each other by the adhesive member 400. Specifically, the display element 300 and the window 600 may be indirectly attached and fixed to each other by the first adhesive layer 410 and the second adhesive layer 420 attached to both surfaces of the light transmitting film 500.

The window 600 may protect the display element 300 from external impact while allowing an image displayed by the display element 300 to be viewed. The window 600 may be made of a glass or polymer material having a light transmitting property. In FIG. 1, the window 600 is shaped like a quadrilateral having each corner curved in a plan view, but embodiments are not limited to this case.

The ink layer INK may be disposed on a surface (a lower surface in the drawing) of the window 600, which faces the display element 300, along the edges of the window 600. The ink layer INK may be a light-shielding pattern layer that blocks light transmission. In an embodiment, the ink layer INK may include carbon black, dye, pigment, paint, etc. having a color that substantially blocks light transmission.

The non-display area NA of the display device 1 described above may be substantially the same area as the area where the ink layer INK is disposed. That is, the non-display area NA may be an area created because light emitted from the display element 300 is blocked by the ink layer INK.

Since the ink layer INK is disposed on a rear surface (the lower surface in the drawing) of the window 600, the adhesive member 400, and in particular, a portion of the first adhesive layer 410, may overlap at least a portion of the ink layer INK. That is, a portion of the adhesive member 400 may also be attached to the ink layer INK. As will be described later, the display device 1 of the present disclosure does not require a low-temperature disassembling process during rework due to the introduction of the light transmitting film 500. Therefore, the portion of the adhesive member 400 which is attached to the ink layer INK can also be easily removed.

In FIG. 1, the ink layer INK (the non-display area NA) is disposed along all edges of the display device 1. However, embodiments are not limited to this case, and the ink layer INK can be disposed on only some of the edges of the display device 1.

FIGS. 3 and 4 are cross-sectional views of display devices 2 and 3 according to embodiments.

The display devices 2 and 3 of FIGS. 3 and 4 are the same as the display device 1 described above with reference to FIGS. 1 and 2 except that light transmitting films 501 and 502 protrude to an opposite side or protrude to both sides. For simplicity, a description of elements and features identical to those described above will be omitted, and differences will be mainly described.

Referring to FIG. 3, a side of the light transmitting film 501 which is opposite the protruding side of the light transmitting film 500 of FIG. 2 may protrude further outward than a side surface of an adhesive member 400 by a predetermined distance T.

Referring to FIG. 4, both sides of the light transmitting film 502 may protrude further outward than side surfaces of an adhesive member 400 by predetermined distances T, respectively. The predetermined distances T may be the same or different from each other.

As described above, the light transmitting films 501 and 502 can be easily removed from the adhesive members 400 by using the protruding portions of the light transmitting films 501 and 502.

FIGS. 5 through 11 are cross-sectional views illustrating operations of a method of reworking the display device 1 of FIGS. 1 and 2.

Figure 5:
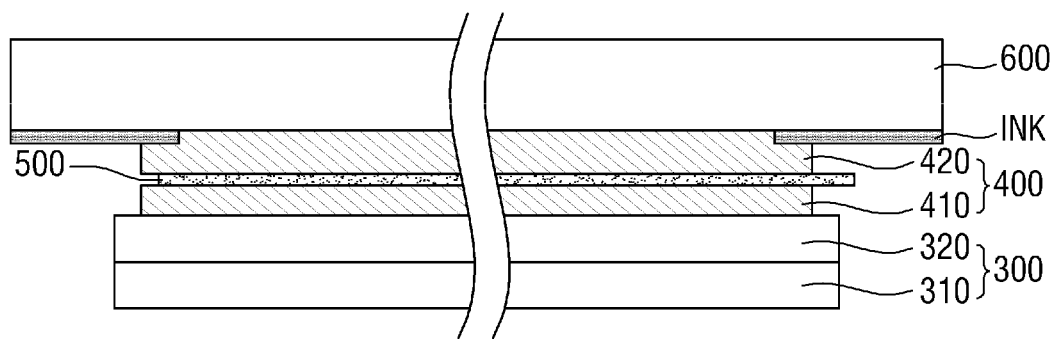
FIGS. 5 through 11 are cross-sectional views illustrating operations of a method of reworking the display device of FIGS. 1 and 2.

Referring to FIG. 5, the display device 1 structured as illustrated in FIGS. 1 and 2 is disassembled to prepare the display element 300 and the window 600 attached to each other by the adhesive member 400. At this time, the chassis 100, the lower sheet 200, etc. of the display device 1 may be removed.

Figure 6:
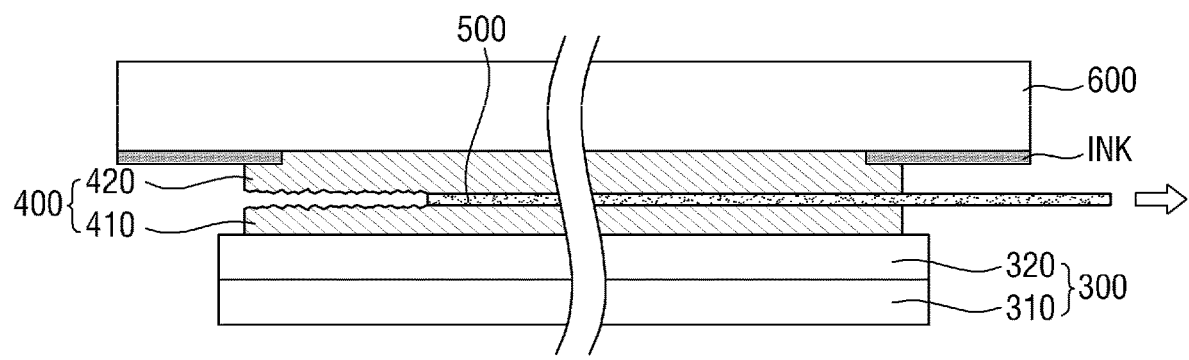
Figure 7:
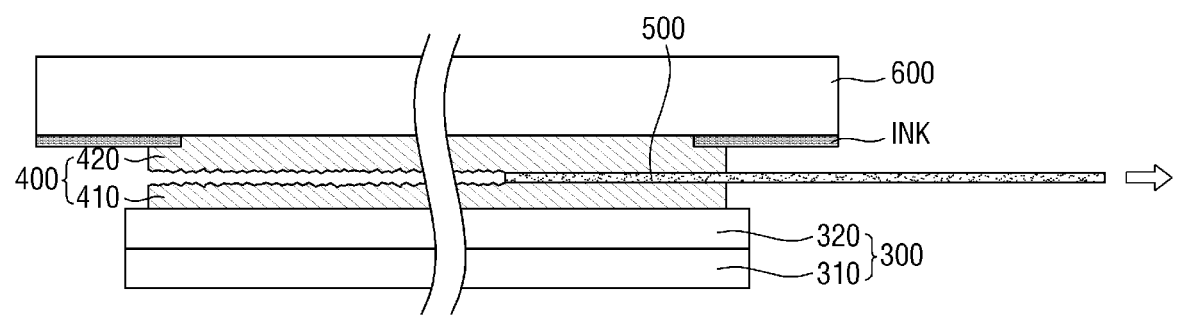

Referring to FIGS. 6 and 7, the light transmitting film 500 is removed from the adhesive member 400 by applying an external force to the light transmitting film 500 disposed in the adhesive member 400. When the light transmitting film 500 is removed, an external force may be applied in a direction in which a portion of the light transmitting film 500 protrudes further than the adhesive member 400 by using the protruding portion of the light transmitting film 500. Then, the light transmitting film 500 can be easily removed from the adhesive member 400.

When the light transmitting film 500 in the adhesive member 400 is removed with an external force, surfaces of the adhesive member 400 that were in contact with the light transmitting film 500 may have many irregularities and increased roughness.

Figure 8:
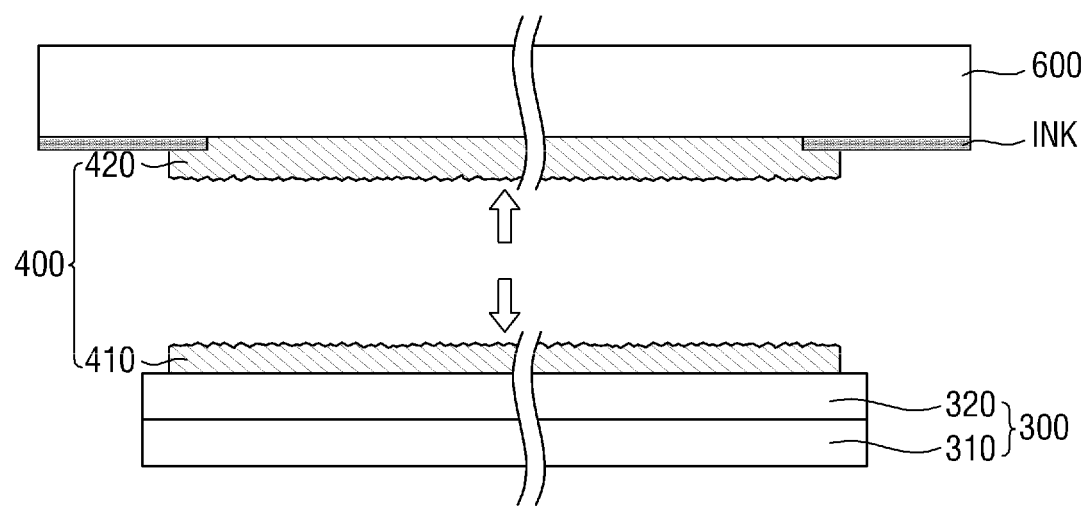

Referring to FIG. 8, the light transmitting film 500 is completely removed from the adhesive member 400, thereby separating the display element 300 and the window 600 from each other. A portion of the adhesive member 400 may remain attached to the display element 300, and the other portion may remain attached to the window 600. The portion attached to the display element 300 is the first adhesive layer 410, and the portion attached to the window 600 is the second adhesive layer 420 as described above.

Figure 9:
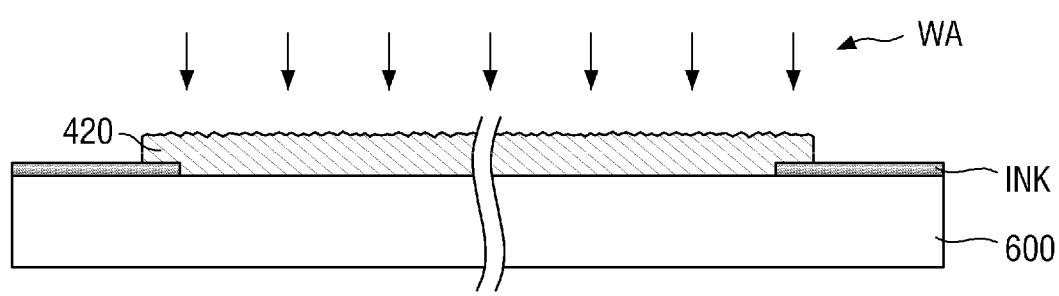

Referring to FIG. 9, a washing agent WA is provided to the adhesive member 400 remaining on the window 600. The washing agent WA may permeate into the adhesive member 400 and swell the adhesive member 400.

In an embodiment, the washing agent WA may include one or more of alkyl acetate, alkyl lactate, isopropyl alcohol, alkyl siloxane, glycol ether, and limonene limonene.

The surface roughness of the adhesive member 400 remaining on the window 600 is increased in the process of removing the light transmitting film 500, thereby increasing the surface area that the washing agent WA can permeate. In addition, since the adhesive member 400 is divided into the first adhesive layer 410 and the second adhesive layer 420, its thickness is reduced to about half. Therefore, the time required for the washing agent WA to uniformly permeate or swell the adhesive member 400 can be remarkably shortened.

Figure 10:
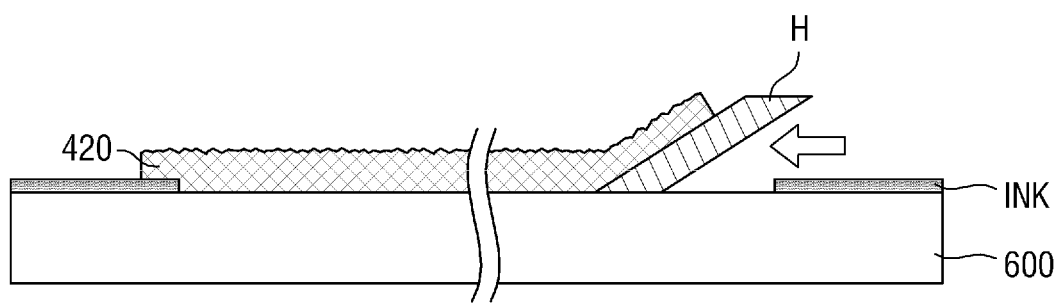

Referring to FIG. 10, the swollen adhesive member 400 is removed. The swollen adhesive member 400 can be easily removed using a dedicated tool H such as a hera or a spatula.

Figure 11:
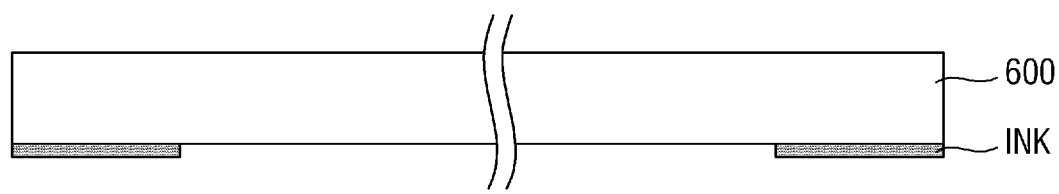
Figure 11:
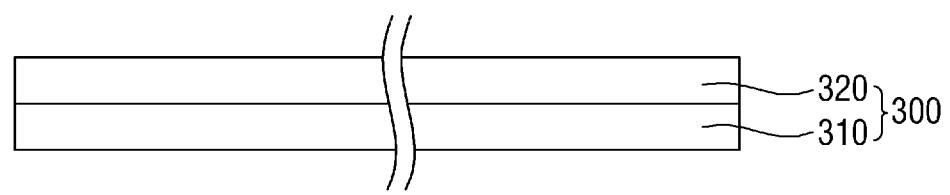

Referring to FIG. 11, the window 600 from which the adhesive member 400 has been completely removed through the above-described operations may be obtained, and the adhesive member 400 may also be completely removed from the display element 300 in the same manner as described above. The display element 300 or the window 600 from which the adhesive member 400 has been completely removed may be used to manufacture another display device 1.

Since the light transmitting film 500 is introduced into the adhesive member 400 of the display device 1 as described above, rework for separating the display element 300 and the window 600 does not require a low-temperature disassembling process in which the adhesive strength of the adhesive member 400 is reduced at a low temperature and then an external force is applied directly to the display element 300 and the window 600. Therefore, it is possible to prevent cracking or shrinkage of the display element 300 or damage of the ink layer INK which may occur as a result of lowering the temperature or directly applying an external force.

Embodiments provide at least one of the following advantages.

A low-temperature disassembling process in which the adhesive strength of an adhesive member is reduced at a low temperature and then an external force is applied directly to a display element and a window is not required in rework for separating the display element and the window. Therefore, it is possible to prevent cracking or shrinkage of the display element or damage of a window ink layer which may occur as a result of lowering the temperature or directly applying an external force.

However, the effects of the embodiments are not restricted to the one set forth herein. The above and other effects of the embodiments will become more apparent to one of daily skill in the art to which the embodiments pertain by referencing the claims.

While the present disclosure has been particularly illustrated and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:

1. A display device comprising:
a display element;
a window which is disposed to face the display element;
an adhesive member which is disposed between the display element and the window and comprises a first adhesive layer disposed on a side of the display element and a second adhesive layer disposed on a side of the window; and
a light transmitting film which is disposed between the first adhesive layer and the second adhesive layer,
wherein at least a side of the light transmitting film protrudes further outward than the adhesive member.

2. The display device of claim 1, wherein the light transmitting film is made of a polymer material.

3. The display device of claim 2, wherein the light transmitting film comprises polyimide (PI).

4. The display device of claim 1, further comprising an ink layer which is disposed on edges of a surface of the window which faces the display element, wherein a portion of the second adhesive layer overlaps at least a portion of the ink layer.

5. The display device of claim 1, wherein the adhesive member is an optical clear adhesive (OCA) or an optical clear resin (OCR).

6. A display device comprising:
a display element;
a window which is disposed to face the display element;
an adhesive member which is disposed between the display element and the window; and
a light transmitting film which is inserted into the adhesive member,
wherein at least a side of the light transmitting film protrudes further outward than the adhesive member.

7. The display device of claim 6, wherein the adhesive member is divided into a first adhesive layer and a second adhesive layer spaced apart from each other by the light transmitting film, wherein the first adhesive layer is attached to the display element, and the second adhesive layer is attached to the window.

8. The display device of claim 6, wherein the light transmitting film is made of a polymer material.

9. The display device of claim 8, wherein the light transmitting film comprises PI.

10. The display device of claim 6, further comprising an ink layer which is disposed on edges of a surface of the window which faces the display element, wherein a portion of the adhesive member overlaps at least a portion of the ink layer.

11. The display device of claim 6, wherein the adhesive member is an OCA or an OCR.

12. A method of reworking a display device, the method comprising:
disassembling the display device to prepare a part comprising a window which is disposed to face a display element, an adhesive member which is disposed between the display element and the window and comprises a first adhesive layer attached to the display element and a second adhesive layer attached to the window, and a light transmitting film which is disposed between the first adhesive layer and the second adhesive layer;
separating the display element and the window, to which the first adhesive layer and the second adhesive layer are respectively attached, by removing the light transmitting film by applying an external force to one side of the light transmitting film; and
removing the adhesive member from the display element or the window by providing a washing agent to the first adhesive layer or the second adhesive layer.

13. The method of claim 12, wherein the removing of the adhesive member by providing the washing agent comprises:
letting the washing agent permeate and swell the first adhesive layer or the second adhesive layer; and
removing the swollen first adhesive layer or the swollen second adhesive layer.

14. The method of claim 12, wherein the washing agent comprises one or more of alkyl acetate, alkyl lactate, isopropyl alcohol, alkyl siloxane, glycol ether, and limonene limonene.

15. The method of claim 12, wherein at least a side of the light transmitting film protrudes further outward than the adhesive member.

16. The method of claim 12, wherein the light transmitting film is made of a polymer material.

17. The method of claim 16, wherein the light transmitting film comprises PI.

18. The method of claim 12, further comprising preparing an ink layer which is disposed on edges of a surface of the window which faces the display element, wherein a portion of the second adhesive layer overlaps at least a portion of the ink layer.

* * * * *